US012354833B2

(12) United States Patent
Fang et al.

(10) Patent No.: US 12,354,833 B2
(45) Date of Patent: Jul. 8, 2025

(54) MULTIPLE LANDING ENERGY SCANNING ELECTRON MICROSCOPY SYSTEMS AND METHODS

(71) Applicant: ASML Netherlands B.V., Veldhoven (NL)

(72) Inventors: Wei Fang, Milpitas, CA (US); Weiming Ren, San Jose, CA (US); Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 567 days.

(21) Appl. No.: 17/630,455

(22) PCT Filed: Jul. 18, 2020

(86) PCT No.: PCT/EP2020/070395
§ 371 (c)(1),
(2) Date: Jan. 26, 2022

(87) PCT Pub. No.: WO2021/018643
PCT Pub. Date: Feb. 4, 2021

(65) Prior Publication Data
US 2022/0254599 A1    Aug. 11, 2022

Related U.S. Application Data

(60) Provisional application No. 62/879,304, filed on Jul. 26, 2019.

(51) Int. Cl.
*H01J 37/28*    (2006.01)
*H01J 37/04*    (2006.01)
(Continued)

(52) U.S. Cl.
CPC ............ *H01J 37/28* (2013.01); *H01J 37/045* (2013.01); *H01J 37/1474* (2013.01);
(Continued)

(58) Field of Classification Search
None
See application file for complete search history.

(56) References Cited

U.S. PATENT DOCUMENTS 4,426,583 A * 1/1984 Chang ................. H01J 37/3007
250/398
4,868,395 A * 9/1989 Kasahara ............... B82Y 10/00
250/398
(Continued)

FOREIGN PATENT DOCUMENTS

CN     1862761 A     11/2006
CN     103137418 A    6/2013
(Continued)

OTHER PUBLICATIONS

International Search Report issued by the International Searching Authority in related foreign Application No. PCT/EP2020/070395, mailed Sep. 29, 2020 (3 pgs.).

(Continued)

*Primary Examiner* — Eliza W Osenbaugh-Stewart
(74) *Attorney, Agent, or Firm* — FINNEGAN, HENDERS FARABOW, GARRETT DUNNER LLP

(57) ABSTRACT

Inspection systems and methods are disclosed. An inspection system may include a first energy source configured to provide a first landing energy beam and a second energy source configured to provide a second landing energy beam. The inspection system may also include a beam controller configured to selectively deliver one of the first and second landing energy beams towards a same field of view, and to switch between delivery of the first and second landing energy beams according to a mode of operation of the inspection system.

20 Claims, 10 Drawing Sheets

(51) Int. Cl.
*H01J 37/147* (2006.01)
*H01J 37/26* (2006.01)

(52) U.S. Cl.
CPC ..... *H01J 37/265* (2013.01); *H01J 2237/0451* (2013.01); *H01J 2237/2817* (2013.01)

(56) References Cited

U.S. PATENT DOCUMENTS

| | | | |
|---|---|---|---|
| 6,252,412 | B1 | 6/2001 | Talbot et al. |
| 8,368,018 | B2 | 2/2013 | Hatakeyama et al. |
| 10,032,602 | B2 | 7/2018 | Chou |
| 10,083,814 | B2 | 9/2018 | Nagaoki et al. |
| 2010/0258722 | A1* | 10/2010 | Fang ............... H01J 37/28 250/310 |
| 2017/0162363 | A1 | 6/2017 | Kim et al. |
| 2020/0300618 | A1* | 9/2020 | Freed ............... G01B 15/00 |

FOREIGN PATENT DOCUMENTS

| | | |
|---|---|---|
| CN | 103681189 A | 3/2014 |
| CN | 105247650 A | 1/2016 |
| CN | 106165054 A | 11/2016 |
| CN | 107408485 A | 11/2017 |
| CN | 108738343 A | 11/2018 |
| JP | S58-201240 A | 11/1983 |
| JP | H03-81940 A | 4/1991 |
| JP | H06-243814 A | 9/1994 |
| JP | 6294130 B2 | 3/2018 |
| TW | 201013737 A | 4/2010 |
| TW | 201334015 A | 8/2013 |
| TW | I456622 B | 10/2014 |
| TW | 201603102 A | 1/2016 |
| TW | 201732280 A | 9/2017 |
| WO | WO 01/88514 A1 | 11/2001 |

OTHER PUBLICATIONS

Office Action from the Intellectual Property Office (IPO) issued in related ROC (Taiwan) Patent Application No. 109124705, mailed May 11, 2021 (16 pgs.).

* cited by examiner

MULTIPLE LANDING ENERGY SCANNING ELECTRON MICROSCOPY SYSTEMS AND METHODS

CROSS-REFERENCE TO RELATED APPLICATIONS

This application claims priority to International Application No. PCT/EP2020/070395, filed Jul. 18, 2020, and published as WO 2021/018643 A1, which claims priority of U.S. application 62/879,304 which was filed on Jul. 26, 2019. The contents of these applications are incorporated herein by reference in their entireties.

TECHNICAL FIELD

The embodiments provided herein disclose scanning electron microscopy (SEM) systems, and more particularly to SEM systems with multiple landing energy beams

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. SEM delivers low energy electrons to a surface and records secondary or backscattered electrons leaving the surface using a detector. By recording such electrons for different excitation positions on the surface, an image can be created with a spatial resolution in the order of nanometers.

As the physical sizes of IC components continue to shrink, accuracy and yield in defect detection become more important, especially with respect to edge placement error (EPE) and overlay shift measurements. Currently there are two techniques to measure EPE or overlay shift based on SEM. One technique is to use high landing energy SEM to take see-through SEM images of different layers of an IC component to measure its EPE or overlay shift. Another technique is to take low landing energy SEM images from different layers and align the images together to measure EPE or overlay shift.

SUMMARY

Embodiments of the present disclosure provide inspection systems and methods. In some embodiments, an inspection system may include a first energy source configured to provide a first landing energy beam and a second energy source configured to provide a second landing energy beam. The inspection system may also include a beam controller configured to selectively deliver one of the first and second landing energy beams towards a same field of view, and to switch between delivery of the first and second landing energy beams according to a mode of operation of the inspection system.

In some embodiments, an inspection method is disclosed. The method may include providing a first landing energy beam and providing a second landing energy beam. The method may also include selectively delivering one of the first and second landing energy beams towards a same field of view. The method may further include switching between delivery of the first and second landing energy beams according to an inspection mode.

In some embodiments, another inspection method is disclosed. The method may include providing a first landing energy beam and providing a second landing energy beam. The method may also include selectively delivering one of the first and second landing energy beams towards a same field of view. The method may further include directing one of the first and second landing energy beams selectively delivered towards the field of view to facilitate scanning of a wafer within the field of view. The field of view may include multiple scan lines. The method may also include switching between delivery of the first and second landing energy beams according to any of: an interlaced scan mode, where one of the scan lines is scanned with the first landing energy beam being delivered towards the field of view and an adjacent one of the scan lines is scanned with the second landing energy beam being delivered towards the field of view; a line scan mode, where each of the scan lines is scanned once with the first landing energy beam being delivered towards the field of view and once with the second landing energy beam being delivered towards the field of view; or a frame scan mode, where the field of view is scanned once with the first landing energy beam being delivered towards the field of view and once with the second landing energy beam being delivered towards the field of view.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
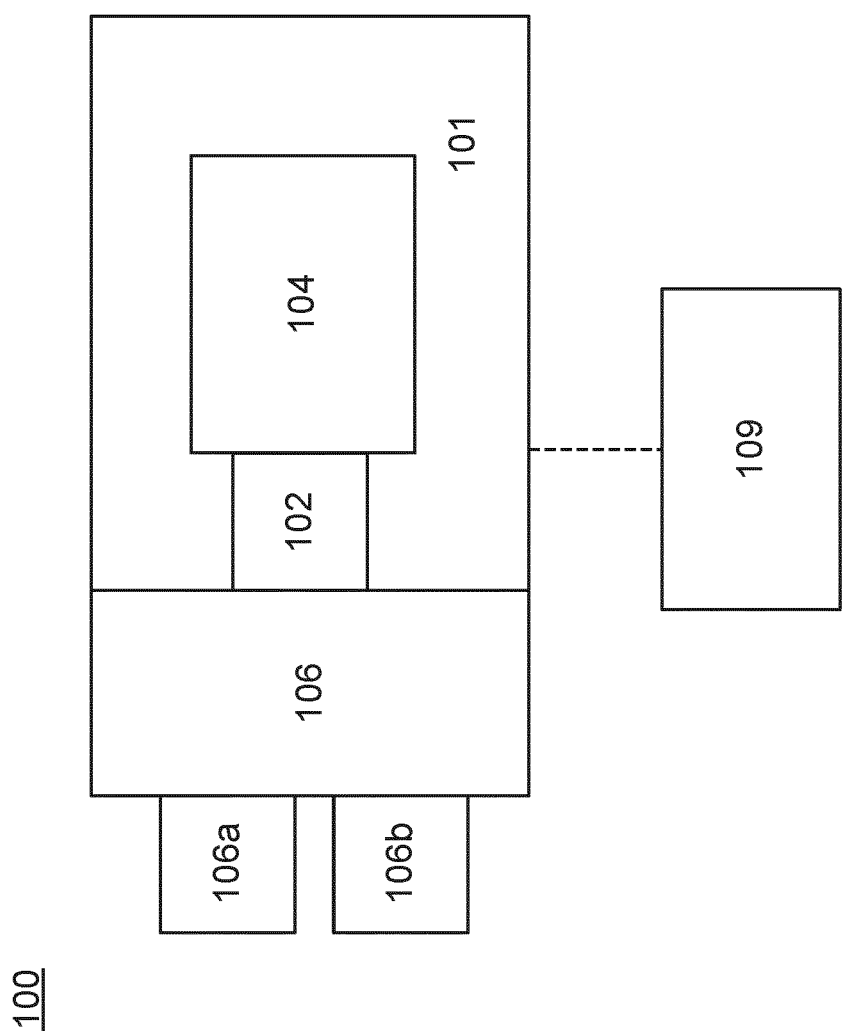
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $1/1000$th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, such as by being formed improperly or being formed in an improper location, then the process can be adjusted so the defect is less likely to recur. Two methods of determining whether a structure is formed in an improper location are to determine its Edge Placement Error (EPE), which is an indication as to how far an edge of a structure is located from its targeted location, or to determine its overlay shift, which is an indication as to how far an edge of a first structure overlays or overlaps a second structure relative its targeted overlay/overlap.

As the physical sizes of IC components continue to shrink, accuracy and yield in defect detection become more important, especially with respect to EPE and overlay shift. There are multiple techniques to measure EPE or overlay shift based on SEM. One technique is to use high landing energy SEM to take see-through SEM images of different layers of an IC component to measure its EPE or overlay shift. However, because top layer of the IC component may respond to the high landing energy SEM differently compared to underlayers, e.g., in terms of image contrast and signal response, using high landing energy SEM to take see-through SEM images will cause measurement errors, particularly around the edges of the top layer. Another technique is to take low landing energy SEM images from different layers and align the images together to measure EPE or overlay shift. However, because the images may contain noise and because the alignment process can introduce errors, the accuracy of the measurements obtained may be negative affected.

Moreover, existing measurement techniques base EPE or overlay measurements on SEM images taken at different settings or at different times, which may lead to lower accuracy and lower throughput. For example, currently, an EPE or overlay measurement is typically carried out by an operator who may first place a sample (e.g., a semiconductor wafer subject to inspection) in an EPE or overlay measurement system, configure the settings (e.g., the landing energy SEM settings) of the measurement system, and obtain an image of the sample using the measurement system. The operator may then adjust the settings of the measurement system (e.g., increase or decrease the energy level of the landing energy SEM) and subsequently obtain another image of the sample using the measurement system. The operator may need to repeat the adjustment process a few times in order to take images of the sample at a few different settings, with each adjustment taking a few seconds to complete. It is noted that the time it takes for the operator to make these adjustments not only limits the number of samples the operator may inspect, but also reduces the measurement accuracy because factors such as temperature, vibration, noise, or the like may vary within the few seconds it takes for the operator to make the adjustments. It is noted that when taking measurements in the order of nanometers, even slight variations can cause drift that will negatively affect measurement accuracy.

Embodiments of the present disclosure provide inspection systems and methods to address some of the shortcomings mentioned above. For example, in some embodiments of the present disclosure, an inspection system may utilize multiple landing energy sources to provide multiple landing energy beams to facilitate the inspection process. More specifically, in some embodiments, the inspection system may include two energy sources. One of the energy sources, referred to as the first energy source, may provide a first landing energy beam. The other energy source, referred to as the second energy source, may provide a second landing energy beam. The first and second landing energy beams may have different energy levels, and each may be suitable for producing SEM images of samples (e.g., semiconductor wafers or wafers made of other material(s)) being inspected. The inspection system may also include a beam controller, which can be used to selectively deliver one of the first landing energy beam or the second landing energy beam towards the same field of view. The beam controller may also switch between delivery of the first landing energy beam or the second landing energy beam. In this manner, the inspection system can automatically obtain SEM images of samples under different energy beams, freeing the operator from having to manually adjust the settings during the measurement process, thereby increasing both the number of samples the operator may inspect and the accuracy of the measurement process. Furthermore, the beam controller can switch between delivery of the first and second landing energy beams very quickly (e.g., in the order of nanoseconds or less), thereby minimizing drift and further improving measurement accuracy.

In some embodiments of the present disclosure, the inspection system may also include one or more deflectors. These deflectors may be used to direct or redirect the first and second landing energy beams towards different areas of the sample (e.g., wafer) being inspected. In this manner, the inspection system may inspect different areas of the sample without having to move the sample. It is noted that if the sample were to be moved during the inspection process, images obtained during the inspection process must be re-aligned to compensate for the move, which introduces errors. By eliminating the need to move the sample during the inspection process, the accuracy of the inspection system can also be improved.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 101, a load-lock chamber 102, an electron beam tool 104, and an equipment front end module (EFEM) 106. Electron beam tool 104 is located within main chamber 101. While the description and drawings are directed to an electron beam, it is appreciated that the embodiments are not used to limit the present disclosure to specific charged particles.

EFEM 106 may include a first loading port 106a and a second loading port 106b. EFEM 106 may include additional loading port(s). First loading port 106a and second loading port 106b may receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 106 may transport the wafers to load-lock chamber 102.

Load-lock chamber 102 is connected to a load/lock vacuum pump system (not shown), which removes gas molecules in load-lock chamber 102 to reach a first pressure below the atmospheric pressure. After reaching the first pressure, one or more robot arms (not shown) transport the wafer from load-lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by electron beam tool 104. In some embodiments, electron beam tool 104 may comprise a multi-beam inspection tool.

Controller 109 may be electronically connected to electron beam tool 104 and may be electronically connected to other components as well. Controller 109 may be a computer configured to execute various controls of charged particle beam inspection system 100. Controller 109 may also include processing circuitry configured to execute various signal and image processing functions. While controller 109 is shown in FIG. 1 as being outside of the structure that includes main chamber 101, load-lock chamber 102, and EFEM 106, it is appreciated that controller 109 can be part of the structure.

While the present disclosure provides examples of main chamber 101 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
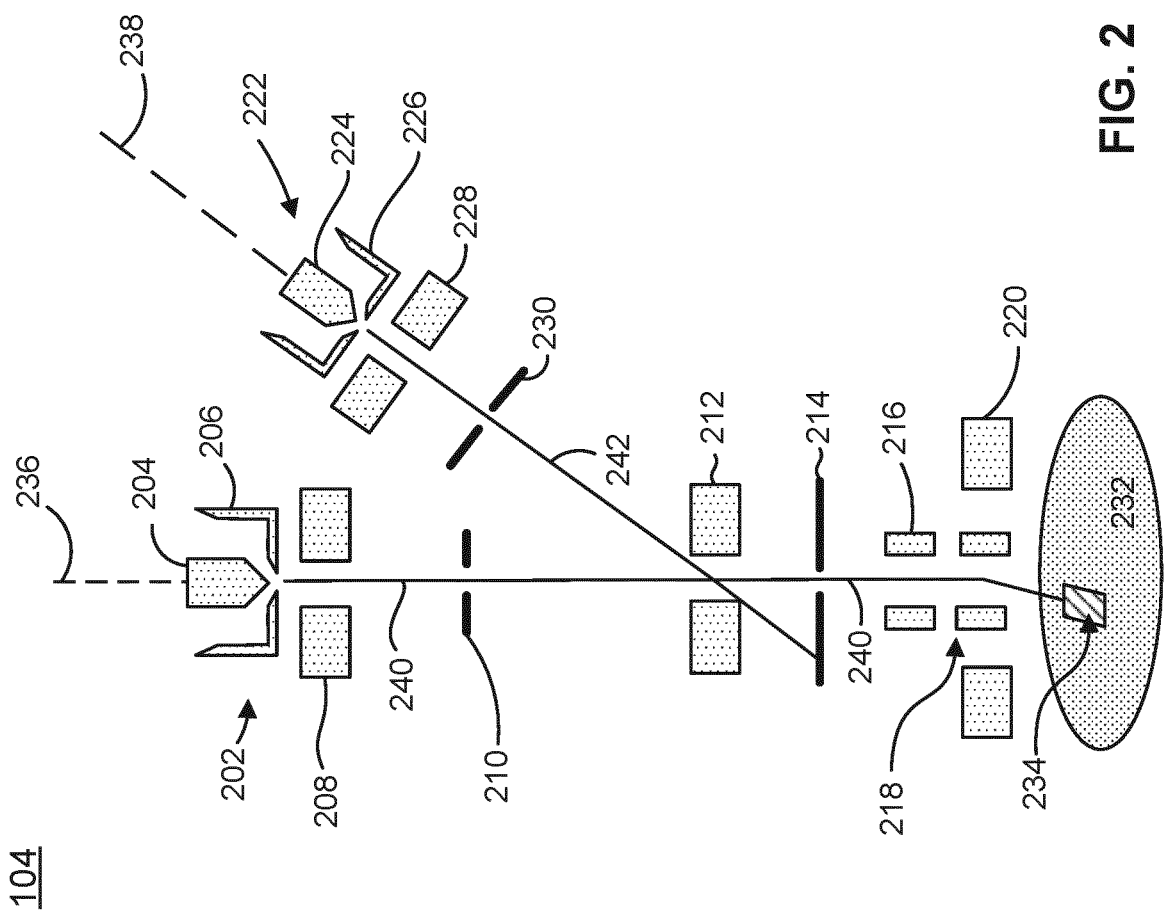
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool 104 that can be a part of the exemplary charged particle beam inspection system 100 of FIG. 1, consistent with embodiments of the present disclosure. As shown in FIG. 2, electron beam tool 104 may include a first energy source 202, a second energy source 222, and a beam selector 212.

First energy source 202 may include a cathode 204 and an anode 206. First energy source 202 may produce a first landing energy beam 240 by applying a voltage between cathode 204 and anode 206. First landing energy beam 240 may pass through a condenser lens 208, which may focus first landing energy beam 240. First landing energy beam 240 may also pass through a beam-limiting aperture 210, which may limit the size of first landing energy beam 240. In some embodiments, first energy source 202 may be positioned to deliver first landing energy beam 240 along a primary optical axis 236 of electron beam tool 104. First landing energy beam 240 delivered along primary optical axis 236 may be referred to as an on-axis beam. Alternatively, first energy source 202 may be positioned to deliver first landing energy beam 240 off-axis with respect to primary optical axis 236 without departing from the scope and spirt of the present disclosure.

Second energy source 222 may include a cathode 224 and an anode 226. Second energy source 222 may produce a second landing energy beam 242 by applying a voltage between cathode 224 and anode 226. Second landing energy beam 242 may pass through a condenser lens 228, which may focus second landing energy beam 242. Second landing energy beam 242 may also pass through a beam-limiting aperture 230, which may limit the size of second landing energy beam 242. In some embodiments, second energy source 222 may be positioned to deliver second landing energy beam 242 along a secondary optical axis 238 of electron beam tool 104. Second landing energy beam 242 delivered along secondary optical axis 238 may be referred to as an off-axis beam (off-axis with respect to primary optical axis 236).

In some embodiments, beam selector 212 may be positioned to receive both first landing energy beam 240 and second landing energy beam 242. First landing energy beam 240 and second landing energy beam 242 may have different energy levels, each being suitable for producing SEM images of a sample 232 being inspected. For example, the first landing energy beam may operate at approximately 1 keV and the second landing energy beam may operate at approximately 25 keV.

Beam selector 212 may selectively deliver only a selected one of first landing energy beam 240 and second landing energy beam 242 towards a field of view 234 to facilitate scanning of sample 232 within field of view 234. Beam selector 212 may further direct the unselected landing energy beams away from field of view 234. For example, in some embodiments, beam selector 212 may include an electrostatic deflector, a magnetic deflector, a Wien filter, or a combination of any of an electrostatic deflector(s), a magnetic deflector(s), or a Wien filter(s). Beam selector 212 may be configured to operate in one of a disengaged state or an engaged state, controllable by applying an appropriate level of excitation to beam selector 212. For an electrostatic deflector, for example, an appropriate level of excitation voltage may be applied to the electrostatic deflector to engage the electrostatic deflector. For a magnetic deflector, an appropriate level of coil currents may be applied to the magnetic deflector to engage the magnetic deflector. For a Wien filter, an appropriate level of coil currents may be applied to the Wien filter to engage the Wien filter.

Figure 3:
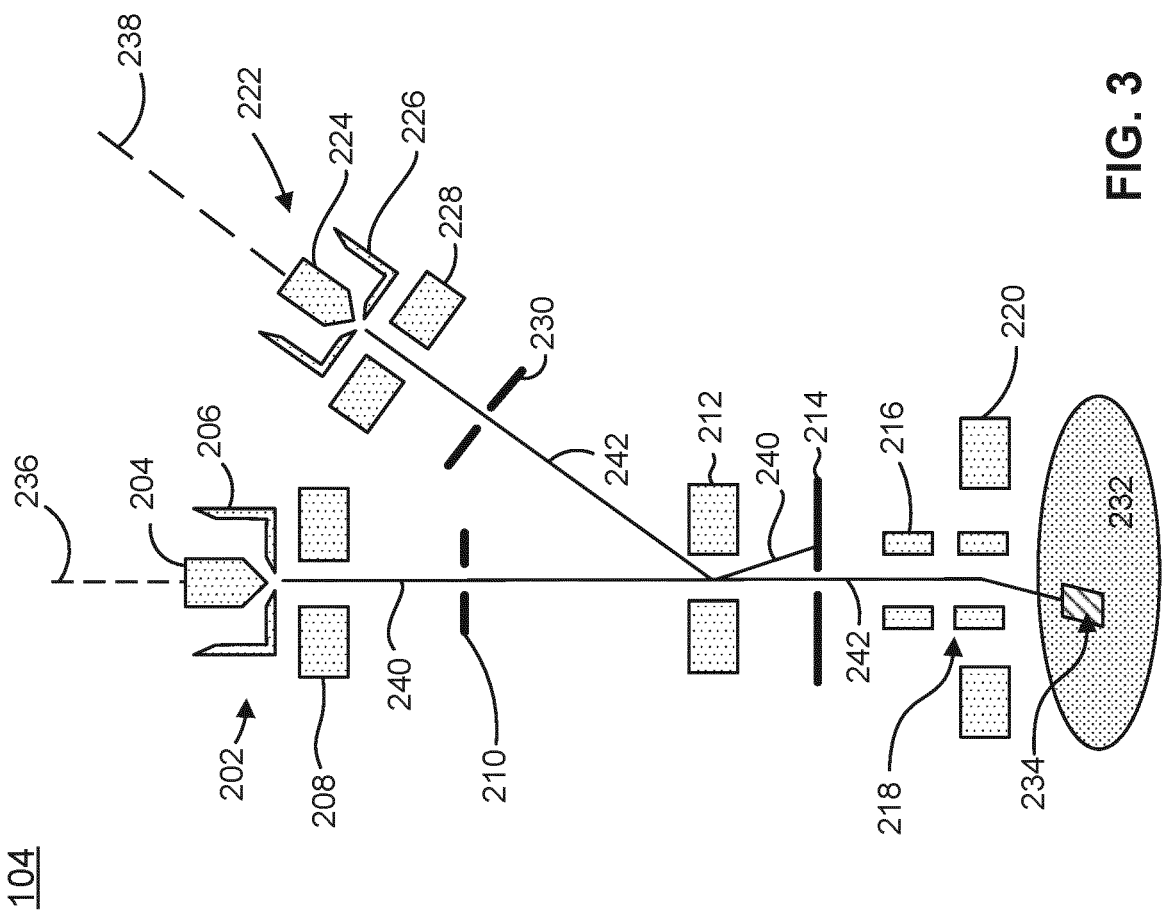
FIG. 3 is a schematic diagram illustrating an exemplary operation of the exemplary electron beam tool of FIG. 2, consistent with embodiments of the present disclosure.

In some embodiments, when beam selector 212 operates in the disengaged state, as shown in FIG. 2, beam selector 212 may allow delivery of first landing energy beam 240 towards field of view 234 and disallow delivery of second landing energy beam 242 towards field of view 234. When beam selector 212 operates in the engaged state, as shown in FIG. 3, beam selector 212 may disallow delivery of first landing energy beam 240 towards field of view 234 (e.g., by directing first landing energy beam 240 away from entering field of view 234) and allow delivery of second landing energy beam 242 towards field of view 234 (e.g., by directing second landing energy beam 242 towards entering field of view 234). In this manner, electron beam tool 104 may selectively engage or disengage beam selector 212, which may in turn switch between delivery of first landing energy beam 240 and second landing energy beam 242 towards field of view 234.

In some embodiments, electron beam tool 104 may utilize one or more sets of scanning deflectors 216 and 218 to direct the selected one of first landing energy beam 240 and second landing energy beam 242 towards field of view 234 to facilitate scanning of sample 232 within field of view 234. It is to be understood that the location of field of view 234 with respect to sample 232 depicted in FIGS. 2 and 3 is provided as an example and is not meant to be limiting. For example, in a scanning process, scanning deflectors 216 and 218 may be controlled to direct the selected one of first landing energy beam 240 and second landing energy beam 242 onto different locations at different time points to facilitate collection of data for image reconstruction for different parts of sample 232. Moreover, scanning deflectors 216 and 218 may also be controlled to direct the selected one of first landing energy beam 240 and second landing energy beam 242 onto different sides of sample 232 at different time points to provide data for stereo image reconstruction of sample 232 structure at those locations.

In some embodiments, electron beam tool 104 may also include an objective lens assembly 220, which may be configured to focus the selected one of first landing energy beam 240 and second landing energy beam 242 onto sample 232 for inspection. In some embodiments, objective lens assembly 220 may include a modified swing objective retarding immersion lens (SORIL). It is contemplated that implementations of objective lens assembly 220 may vary without departing from the scope and spirt of the present disclosure.

In some embodiments, electron beam tool 104 may additionally include a detector 214, which may be utilized to record secondary or backscattered electrons leaving sample 232 after electron beam tool 104 delivers the selected one of first landing energy beam 240 and second landing energy beam 242 towards field of view 234 to facilitate scanning of sample 232 within field of view 234. By recording such electrons for different excitation positions, an image can be created with a spatial resolution in the order of nanometers.

Figure 4:
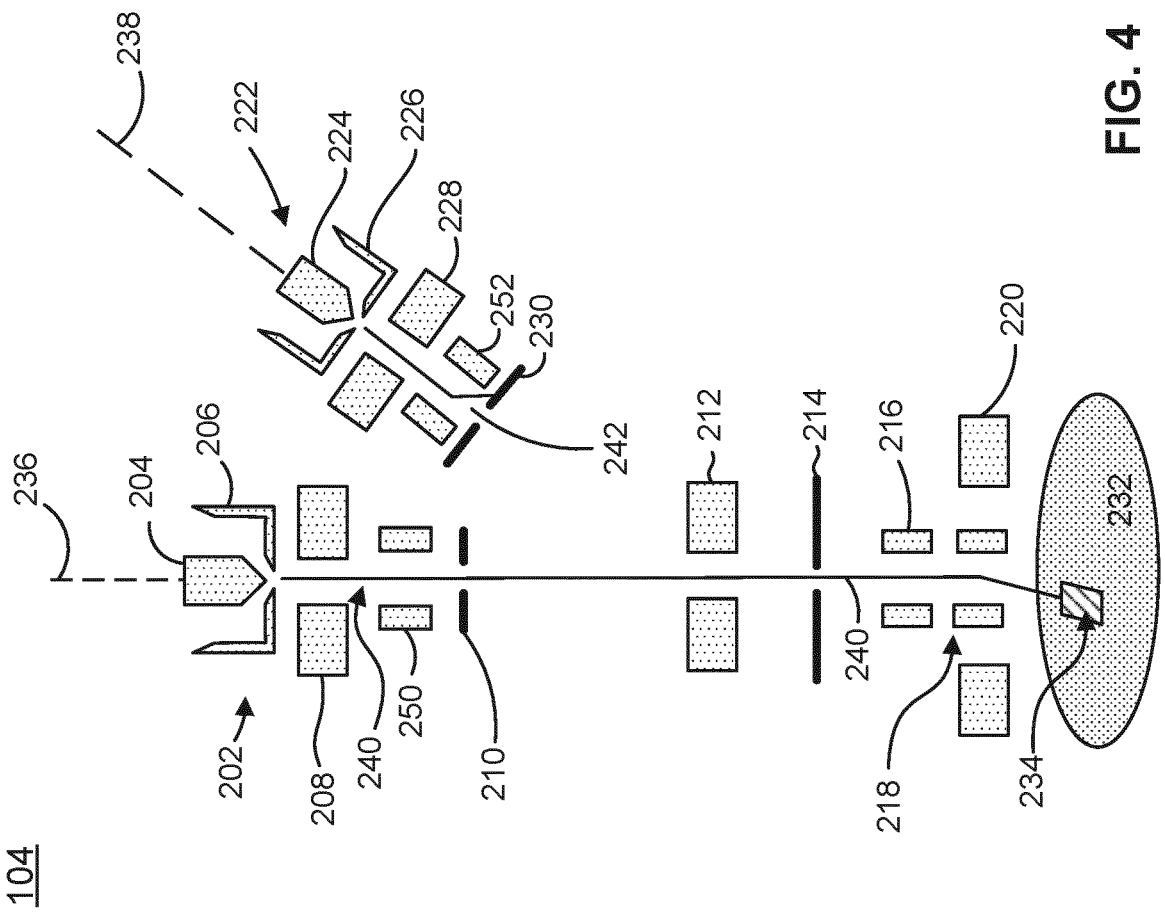
FIG. 4 is a schematic diagram illustrating an exemplary electron beam tool that can be a part of the exemplary electron beam inspection system of FIG. 1, consistent with embodiments of the present disclosure.
Figure 5:
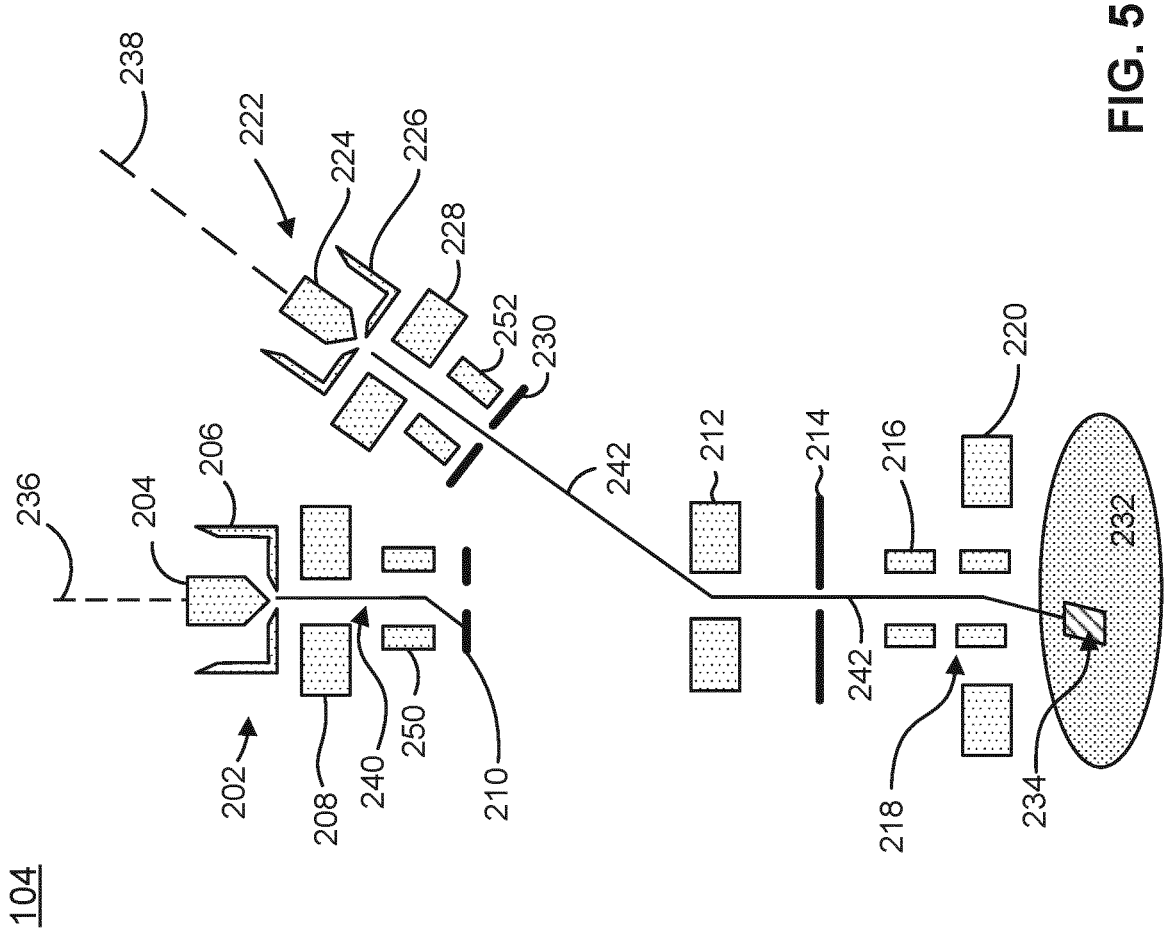
FIG. 5 is a schematic diagram illustrating an exemplary operation of the exemplary electron beam tool of FIG. 4, consistent with embodiments of the present disclosure.

Referring now generally to FIGS. 4 and 5, which illustrate schematic diagrams illustrating another exemplary electron beam tool 104 that can be a part of the exemplary charged particle beam inspection system 100 of FIG. 1, consistent with embodiments of the present disclosure. As shown in FIG. 4, electron beam tool 104 may utilize a beam selector 212, a first beam blanker 250, and a second beam blanker 252 to jointly control the landing energy beams Beam selector 212, first beam blanker 250, and second beam blanker 252 may be jointly referred to as a beam controller.

In some embodiments, first beam blanker 250 may be configured to deflect first landing energy beam 240, such as into beam-limiting aperture 210, when first beam blanker 250 is engaged. In this manner, first beam blanker 250 can prevent delivery of first landing energy beam 240 towards beam selector 212 when first beam blanker 250 is engaged. Second beam blanker 252 may be configured to deflect second landing energy beam 242, such as into beam-limiting aperture 230, when second beam blanker 252 is engaged. In this manner, second beam blanker 252 can prevent delivery of second landing energy beam 242 towards beam selector 212 when second beam blanker 252 is engaged.

In some embodiments, electron beam tool 104 may selectively engage one of first beam blanker 250 or second beam blanker 252 so that only one of one of first landing energy beam 240 and second landing energy beam 242 is delivered to the beam selector at a time. For example, when electron beam tool 104 selectively engages second beam blanker 252 as shown in FIG. 4, second beam blanker 252 can prevent delivery of second landing energy beam 242 towards beam selector 212. When electron beam tool 104 selectively engages first beam blanker 250 as shown in FIG. 5, first beam blanker 250 can prevent delivery of first landing energy beam 240 towards beam selector 212.

Beam selector 212 may operate in manners similar to that described above. For instance, beam selector 212 may deliver only a selected one of first landing energy beam 240 and second landing energy beam 242 towards a field of view 234 to facilitate scanning of sample 232 within field of view 234. Beam selector 212 may be configured to operate in one of a disengaged state or an engaged state, controllable by applying an appropriate level of excitation to beam selector 212. When beam selector 212 operates in the disengaged state, as shown in FIG. 4, beam selector 212 may allow delivery of first landing energy beam 240 towards field of view 234. When beam selector 212 operates in the engaged state, as shown in FIG. 5, beam selector 212 may allow delivery of second landing energy beam 242 towards field of view 234 (e.g., by directing second landing energy beam 242 towards entering field of view 234). In this manner, electron beam tool 104 may selectively engage one of first beam blanker 250 or second beam blanker 252, and selectively engage or disengage beam selector 212, to switch between delivery of first landing energy beam 240 and second landing energy beam 242 towards field of view 234.

Figure 6:
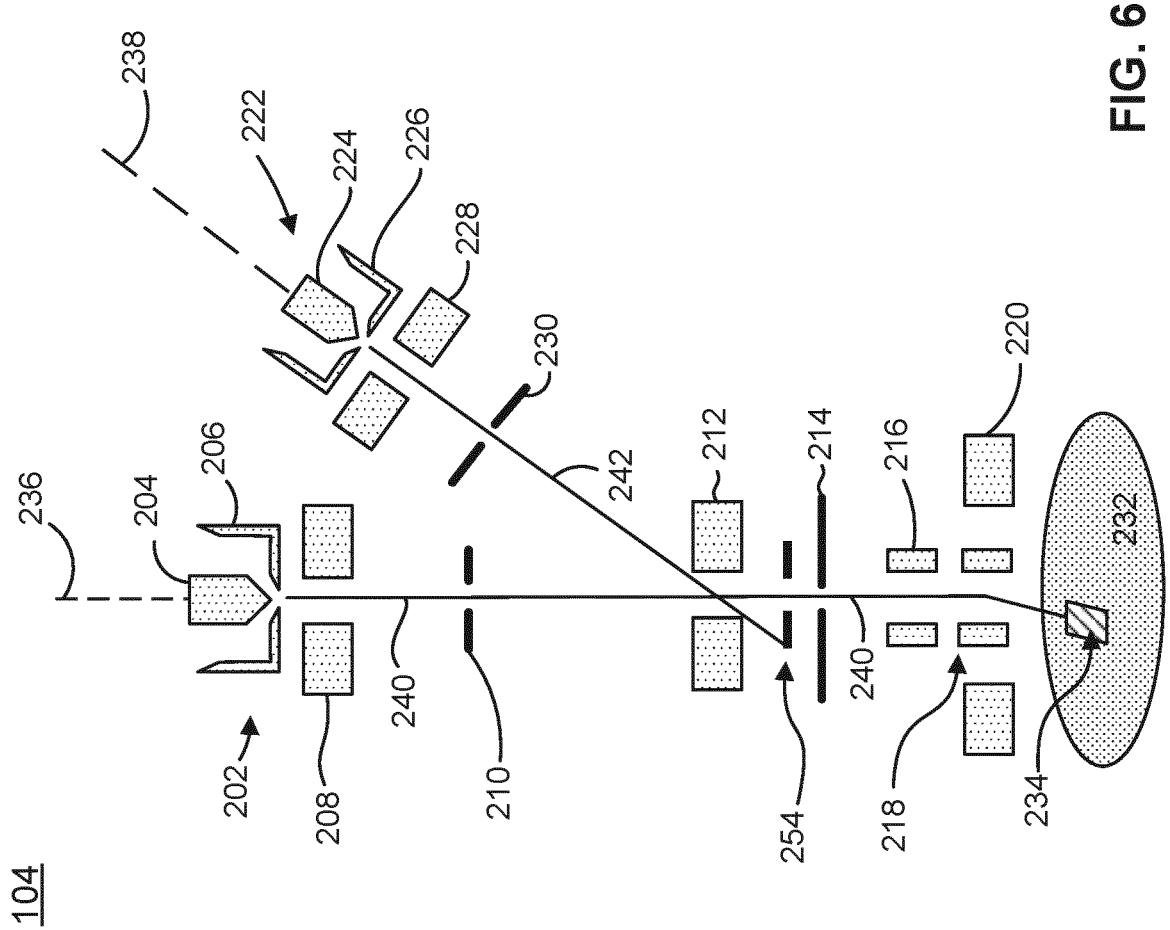
FIG. 6 is a schematic diagram illustrating an exemplary electron beam tool that can be a part of the exemplary electron beam inspection system of FIG. 1, consistent with embodiments of the present disclosure.
Figure 7:
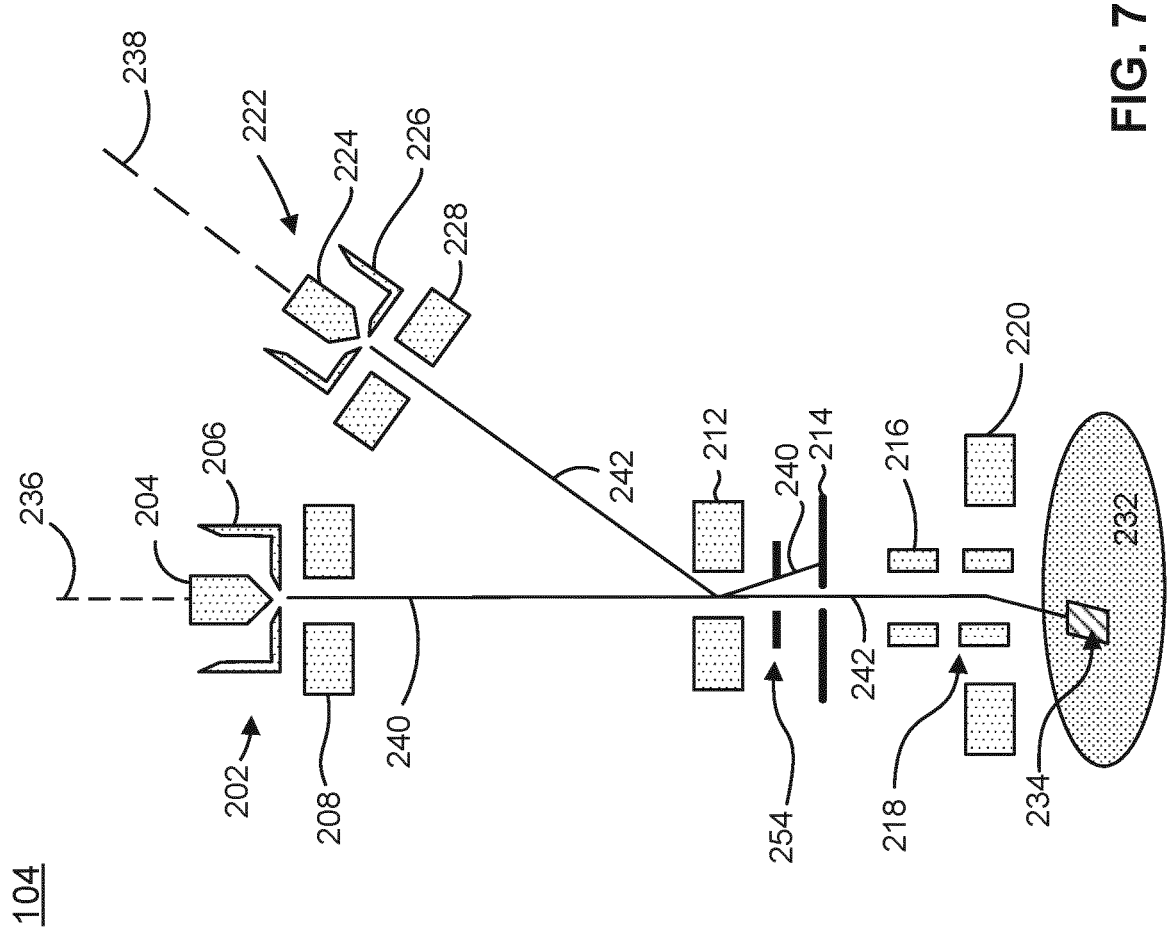
FIG. 7 is a schematic diagram illustrating an exemplary operation of the exemplary electron beam tool of FIG. 6, consistent with embodiments of the present disclosure.

Referring now generally to FIGS. 6 and 7, which illustrate schematic diagrams illustrating another exemplary electron beam tool 104 that can be a part of the exemplary charged particle beam inspection system 100 of FIG. 1, consistent with embodiments of the present disclosure. As shown in FIG. 6, electron beam tool 104 may utilize a beam selector 212 in conjunction with a beam-limiting aperture 254 to jointly control the landing energy beams. Beam selector 212 and beam-limiting aperture 254 may be jointly referred to as a beam controller.

In some embodiments, beam-limiting aperture 254 may be utilized in addition to beam-limiting apertures 210 and 230 (FIG. 2). Alternatively, beam-limiting aperture 254 may be utilized to replace beam-limiting apertures 210 and 230 (FIG. 2). Beam-limiting aperture 254 may be positioned on beam paths of both first landing energy beam 240 and second landing energy beam 242. In this manner, when beam selector 212 operates to allow delivery of first landing energy beam 240 towards field of view 234, beam-limiting aperture 254 may block second landing energy beam 242 to prevent delivery of second landing energy beam 242 towards field of view 234, as shown in FIG. 6. When beam selector 212 operates to direct second landing energy beam 242 towards field of view 234, beam-limiting aperture 254 may allow delivery of second landing energy beam 242 towards field of view 234, as shown in FIG. 7. It is noted that when beam selector 212 operates to direct second landing energy beam 242 towards field of view 234, beam selector 212 may also direct first landing energy beam 240 away from field of view 234. In some embodiments, beam-limiting aperture 254 may be positioned to block the redirected first landing energy beam 240. Alternatively, detector 214 may be positioned to block the redirected first landing energy beam 240, as shown in FIG. 7.

Figure 8:
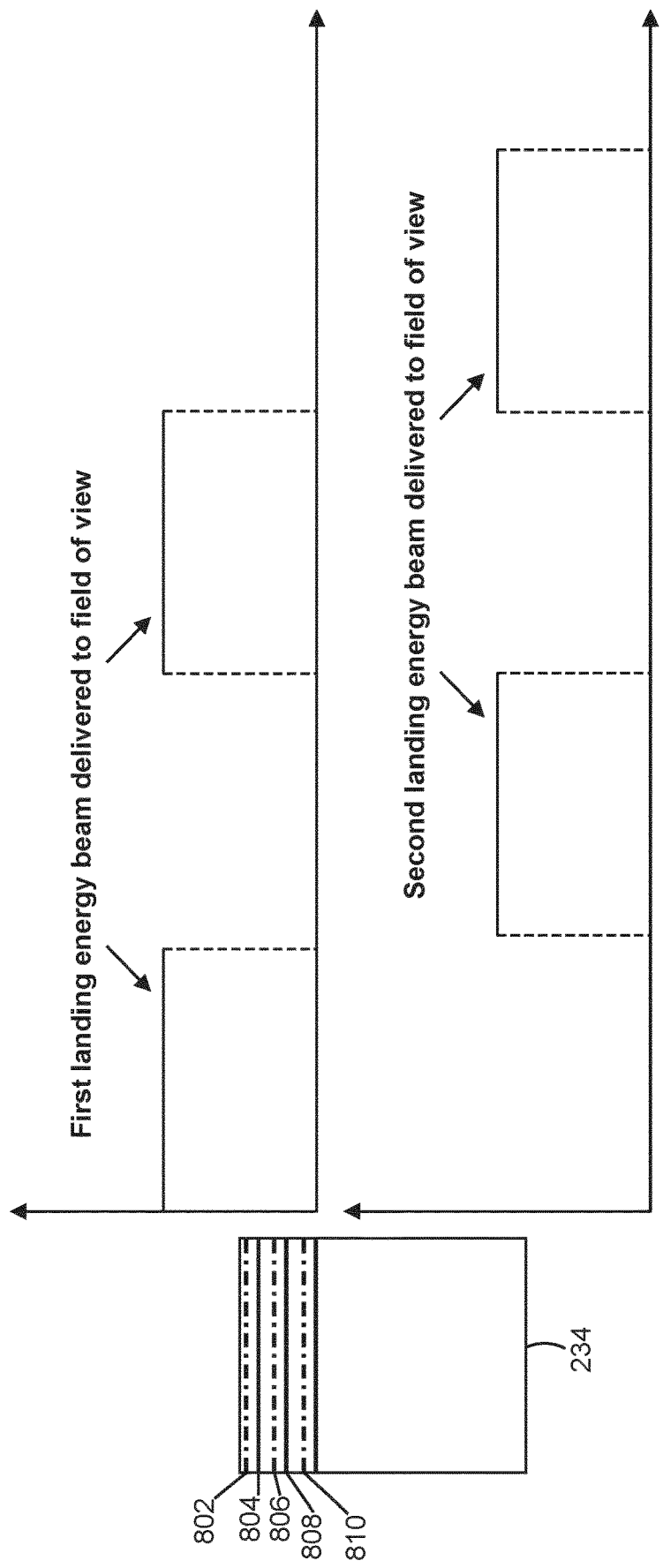
FIG. 8 is an illustration depicting an exemplary scan mode supported by an inspection system, consistent with embodiments of the present disclosure.

Reference is now made to FIG. 8, which illustrates an exemplary scan mode supported by inspection system 100 of FIG. 1 that utilizes an electron beam tool 104 consistent with embodiments of the present disclosure. Electron beam tool 104 may utilize one or more sets of scanning deflectors 216 and 218 (shown in FIGS. 2-7) to direct the selected one of first landing energy beam 240 and second landing energy beam 242 towards field of view 234 to facilitate scanning of sample 232 within field of view 234. As shown in FIG. 8, field of view 234 may include multiple scan lines 802-810. In some embodiments, electron beam tool 104 may utilize one or more sets of scanning deflectors 216 and 218 to support an interlaced scan mode, where electron beam tool 104 may utilize scanning deflectors 216 and 218 to facilitate scanning of one scan line (e.g., a first scan line 802) when first landing energy beam 240 is delivered to field of view 234 and scanning of an adjacent scan line (e.g., a second scan line 804) when second landing energy beam 242 is delivered to field of view 234. Electron beam tool 104 may utilize scanning deflectors 216 and 218 to facilitate scanning of the next scan line (e.g., a third scan line 806) when first landing energy beam 240 is delivered to field of view 234 again, and repeat the scanning process so that every other scan line is scanned using first landing energy beam 240 while the remaining scan lines are scanned using second landing energy beam 242 in an interlaced manner It is to be understood that electron beam tool 104 may utilize scanning deflectors 216 and 218 to facilitate other scanning patterns without departing from the scope and spirt of the present disclosure. For example, in some embodiments, electron beam tool 104 may utilize one or more sets of scanning deflectors 216 and 218 to support a line scan mode, where electron beam tool 104 may utilize scanning deflectors 216 and 218 to facilitate scanning of each scan line 802-810 once when first landing energy beam 240 is delivered to field of view 234 and once when second landing energy beam 242 is delivered to field of view 234.

Figure 9:
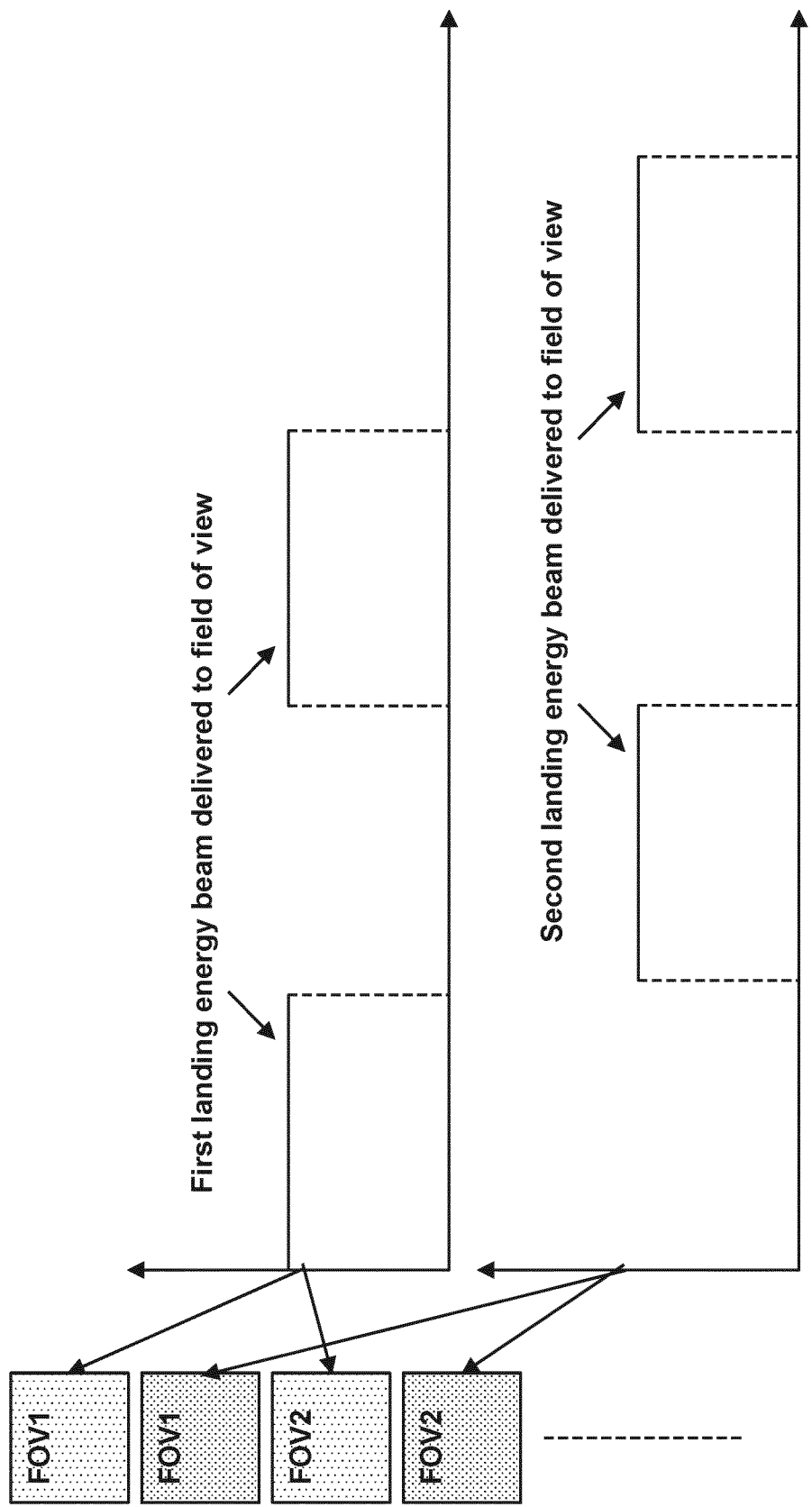
FIG. 9 is an illustration depicting an exemplary scan mode supported by an inspection system, consistent with embodiments of the present disclosure.

Reference is now made to FIG. 9, which illustrates another exemplary scan mode supported by inspection system 100 of FIG. 1 that utilizes an electron beam tool 104 consistent with embodiments of the present disclosure. As shown in FIG. 9, in some embodiments, electron beam tool 104 may utilize one or more sets of scanning deflectors 216 and 218 to support a frame scan mode, where electron beam tool 104 may utilize scanning deflectors 216 and 218 to facilitate scanning of a field of view, e.g., the entire field of view FOV1, once when first landing energy beam 240 is delivered to field of view FOV1 and once when second landing energy beam 242 is delivered to field of view FOV1. Electron beam tool 104 may then utilize one or more sets of scanning deflectors 216 and 218 to direct the selected one of first landing energy beam 240 and second landing energy beam 242 onto a different field of view, e.g., FOV2, and utilize scanning deflectors 216 and 218 to facilitate scanning of the entire field of view FOV2 once when first landing energy beam 240 is delivered to field of view FOV2 and once when second landing energy beam 242 is delivered to field of view FOV2.

It is to be understood that electron beam tool 104 may utilize scanning deflectors 216 and 218 to facilitate other scan mode without departing from the scope and spirt of the present disclosure. Electron beam tool 104 may also utilize the beam controller (e.g., including beam selector 212, first beam blanker 250, second beam blanker 252, or beam-limiting aperture 254) to switch between delivering first landing energy beam 240 and second landing energy beam 242 according to the selected scan mode.

Figure 10:
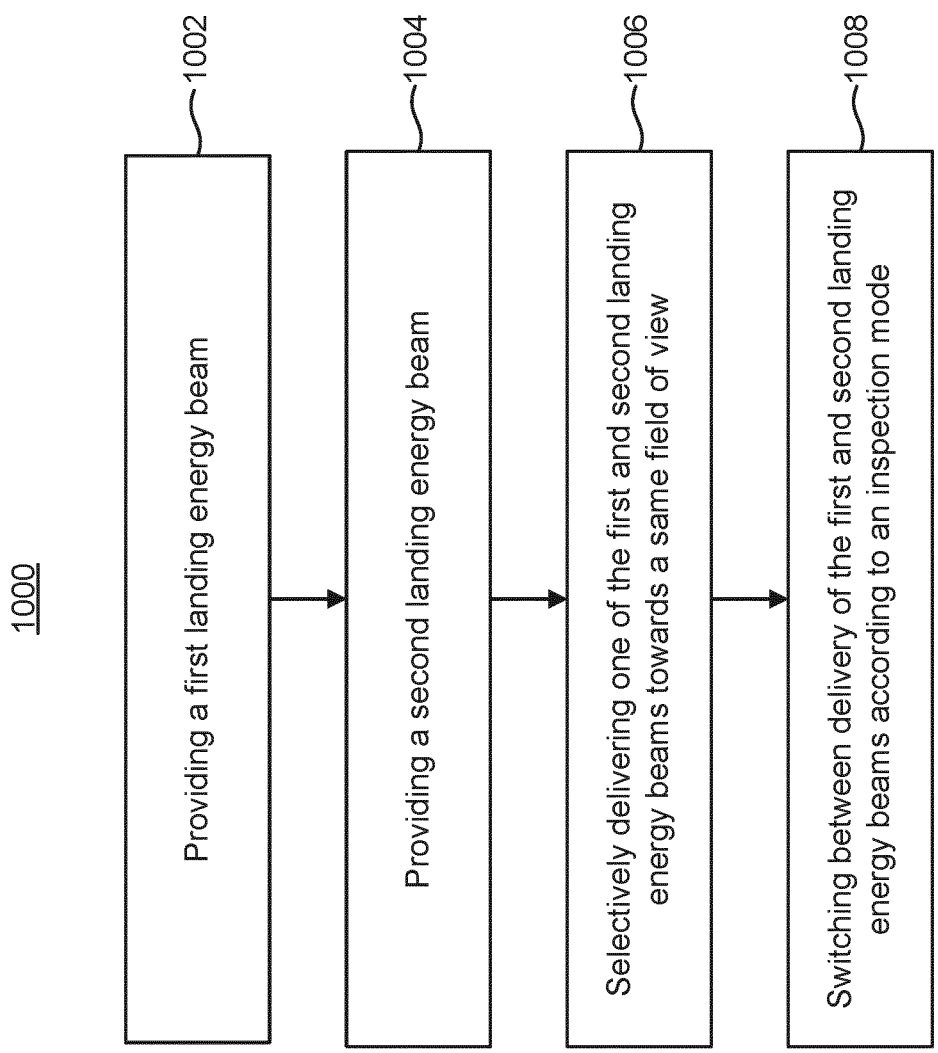
FIG. 10 is a process flowchart representing an exemplary inspection method, consistent with embodiments of the present disclosure.

Reference is now made to FIG. 10, which illustrates a process flowchart representing an exemplary inspection method 1000, consistent with embodiments of the present disclosure. Method 1000 may be performed by controller 109 of EBI system 100, as shown in FIG. 1, for example. Controller 109 may be programmed to implement one or more steps of method 1000. For example, controller 109 may instruct a module of a charged particle beam apparatus to activate a charged-particle source to generate a charged particle beam and carry out other functions.

In step 1002, a first landing energy beam (e.g., first landing energy beam 240 of FIG. 2) may be generated by activating a first energy source (e.g., first energy source 202 of FIG. 2). For example, first energy source 202 may be powered on to emit the first landing energy beam that is formed along a primary optical axis. The first energy source may be activated remotely, for example, by using a software, an application, or a set of instructions for a processor of a controller to power the electron source through a control circuitry.

In step 1004, a second landing energy beam (e.g., second landing energy beam 242 of FIG. 2) may be generated by activating a second energy source (e.g., second energy source 222 of FIG. 2); thereby having both the first and second energy beams being emitted at the same time. For example, second energy source 222 may be powered on to emit the second landing energy beam that is formed off the primary optical axis. The second energy source may be activated remotely, for example, by using a software, an application, or a set of instructions for a processor of a controller to power the electron source through a control circuitry.

In step 1006, one of the first and second landing energy beams may be selectively delivered towards a field of view (e.g., field of view 234 of FIG. 2). For example, controller 109 may selectively engage or disengage a beam selector (e.g., beam selector 212 of FIG. 2), a beam blanker (e.g., first beam blanker 250 or second beam blanker 252 of FIG. 4), or a beam-limiting aperture (e.g., beam-limiting aperture 254 of FIG. 6), as described above, to selectively deliver one of the first and second landing energy beams towards the field of view.

In step 1008, the delivery of the first and second landing energy beams may be switched according to an inspection mode. For example, controller 109 may selectively engage or disengage the beam selector, the beam blanker, or the beam-limiting aperture, as described above, to switch between delivery of the first and second landing energy beams according to the inspection mode.

In some embodiments, one of the first and second landing energy beams selectively delivered towards the field of view may be directed to facilitate scanning of a sample (e.g., a wafer being inspected) within the field of view. In some embodiments, the field of view may include a plurality of scan lines. In some embodiments, the delivery of the first and second landing energy beams may be switched according to inspection modes including, but not limited to, an interlaced scan mode, a line scan mode, and a frame scan mode.

In some embodiments, when inspection method 1000 operates in the interlaced scan mode, controller 109 may control one or more sets of scanning deflectors (e.g., scanning deflectors 216 and 218 of FIG. 2) to facilitate scanning of one scan line (e.g., a first scan line 802 of FIG. 8) with the first landing energy beam being delivered towards the field of view and scanning of an adjacent scan line (e.g., a second scan line 804 of FIG. 8) with the second landing energy beam being delivered towards the field of view.

In some embodiments, when inspection method 1000 operates in the line scan mode, controller 109 may control one or more sets of scanning deflectors (e.g., scanning deflectors 216 and 218 of FIG. 2) to facilitate scanning of each of the plurality of scan lines once with the first landing energy beam being delivered towards the field of view and once with the second landing energy beam being delivered towards the field of view.

In some embodiments, when inspection method 1000 operates in the frame scan mode, controller 109 may control one or more sets of scanning deflectors (e.g., scanning deflectors 216 and 218 of FIG. 2) to facilitate scanning of the field of view once with the first landing energy beam being delivered towards the field of view and once with the second landing energy beam being delivered towards the field of view.

The embodiments may further be described using the following clauses:

1. An inspection system, comprising:
   a first energy source configured to provide a first landing energy beam;
   a second energy source configured to provide a second landing energy beam; and
   a beam controller configured to:
     selectively deliver one of the first and second landing energy beams towards a same field of view; and
     switch between delivery of the first and second landing energy beams according to a mode of operation of the inspection system.

2. The system of clause 1, wherein each of the first and second landing energy beams is a landing energy beam suitable for producing a scanning electron microscopy (SEM) image of a wafer.

3. The system of any one of clauses 1 and 2, wherein the first and second landing energy beams have different energy levels.

4. The system of any one of clauses 1-3, wherein the first landing energy beam is an on-axis beam and the second landing energy beam is an off-axis beam.

5. The system of any one of clauses 1-4, wherein the beam controller comprises:
   a beam selector positioned to receive both the first and second landing energy beams, the beam selector being configured to allow delivery of only a selected one of the first and second landing energy beams towards the field of view at a time.

6. The system of clause 5, wherein the beam selector is configured to direct an unselected one of the first and second landing energy beams away from the field of view.

7. The system of any one of clauses 5 and 6, wherein the beam selector is configured to operate in one of:
   a disengaged state, wherein the beam selector allows delivery of the first landing energy beam towards the field of view and disallows delivery of the second landing energy beam towards the field of view; or
   an engaged state, wherein the beam selector deflects the first landing energy beam away from the field of view and deflects the second landing energy beam towards the field of view.

8. The system of any one of clauses 5-7, wherein the beam selector comprises at least one of: an electrostatic deflector or a magnetic deflector or a Wien filter.

9. The system of any one of clauses 5-8, wherein the beam controller further comprises:
   a first beam blanker configured to deflect the first landing energy beam when the first beam blanker is engaged to prevent delivery of the first landing energy beam towards the beam selector; and
   a second beam blanker configured to deflect the second landing energy beam when the second beam blanker is engaged to prevent delivery of the second landing energy beam towards the beam selector.

10. The system of clause 9, wherein the beam controller is configured to selectively engage one of the first and second beam blankers so that only one of the first and second landing energy beams is delivered to the beam selector at a time.

11. The system of any one of clauses 5-10, wherein the beam controller further comprises:
   a beam-limiting aperture positioned on beam paths of both the first and second landing energy beams.

12. The system of clause 11, wherein when the beam selector operates to allow delivery of the first landing energy beam towards the field of view, the beam-limiting aperture blocks the second landing energy beam.

13. The system of any one of clauses 11 and 12, wherein when the beam selector operates to deflect the first landing energy beam away from the field of view, the beam-limiting aperture allows delivery of the second landing energy beam towards the field of view.

14. The system of any one of clauses 1-13, further comprising:
   at least one scanning deflector configured to direct one of the first and second landing energy beams selectively delivered towards the field of view to facilitate scanning of a wafer within the field of view.

15. The system of clause 14, wherein the field of view comprises a plurality of scan lines and the at least one scanning deflector is configured to operate in one of:
   an interlaced scan mode, wherein the at least one scanning deflector facilitates scanning of one of the plurality of scan lines with the beam controller delivering the first landing energy beam towards the field of view and scanning of an adjacent one of the plurality of scan lines with the beam controller delivering the second landing energy beam towards the field of view;
   a line scan mode, wherein the at least one scanning deflector facilitates scanning of each of the plurality of scan lines once with the beam controller delivering the first landing energy beam towards the field of view and once with the beam controller delivering the second landing energy beam towards the field of view; or a frame scan mode, wherein the at least one scanning deflector facilitates scanning of the field of view once with the beam controller delivering the first landing energy beam towards the field of view and once with the beam controller delivering the second landing energy beam towards the field of view.

16. The system of clause 15, wherein the beam controller is configured to switch between delivering the first and second landing energy beams towards the field of view according to one of: the interlaced scan mode, the line scan mode, or the frame scan mode.

17. An inspection method, comprising:
providing a first landing energy beam;
providing a second landing energy beam;
selectively delivering one of the first and second landing energy beams towards a same field of view; and
switching between delivery of the first and second landing energy beams according to an inspection mode.

18. The method of clause 17, wherein each of the first and second landing energy beams is a landing energy beam suitable for producing a scanning electron microscopy (SEM) image of a wafer.

19. The method of any one of clauses 17 and 18, wherein the first and second landing energy beams have different energy levels.

20. The method of any one of clauses 17-19, wherein the first landing energy beam is provided as an on-axis beam and the second landing energy beam is provided as an off-axis beam.

21. The method of any one of clauses 17-20, further comprising:
directing one of the first and second landing energy beams selectively delivered towards the field of view to facilitate scanning of a wafer within the field of view.

22. The method of clause 21, wherein the field of view comprises a plurality of scan lines.

23. The method of clause 22, wherein the switching between delivery of the first and second landing energy beams further comprises:
switching between delivery of the first and second landing energy beams according to an interlaced scan mode, wherein one of the plurality of scan lines is scanned with the first landing energy beam being delivered towards the field of view and an adjacent one of the plurality of scan lines is scanned with the second landing energy beam being delivered towards the field of view.

24. The method of clause 22, wherein the switching between delivery of the first and second landing energy beams further comprises:
switching between delivery of the first and second landing energy beams according to a line scan mode, wherein each of the plurality of scan lines is scanned once with the first landing energy beam being delivered towards the field of view and once with the second landing energy beam being delivered towards the field of view.

25. The method of clause 22, wherein the switching between delivery of the first and second landing energy beams further comprises:
switching between delivery of the first and second landing energy beams according to a frame scan mode, wherein the field of view is scanned once with the first landing energy beam being delivered towards the field of view and once with the second landing energy beam being delivered towards the field of view.

26. An inspection method, comprising:
providing a first landing energy beam;
providing a second landing energy beam;
selectively delivering one of the first and second landing energy beams towards a same field of view;
directing one of the first and second landing energy beams selectively delivered towards the field of view to facilitate scanning of a wafer within the field of view, wherein the field of view comprises a plurality of scan lines; and
switching between delivery of the first and second landing energy beams according to any of:
an interlaced scan mode, wherein one of the plurality of scan lines is scanned with the first landing energy beam being delivered towards the field of view and an adjacent one of the plurality of scan lines is scanned with the second landing energy beam being delivered towards the field of view;
a line scan mode, wherein each of the plurality of scan lines is scanned once with the first landing energy beam being delivered towards the field of view and once with the second landing energy beam being delivered towards the field of view; or
a frame scan mode, wherein the field of view is scanned once with the first landing energy beam being delivered towards the field of view and once with the second landing energy beam being delivered towards the field of view.

27. The method of clause 26, wherein each of the first and second landing energy beams is a landing energy beam suitable for producing a scanning electron microscopy (SEM) image of a wafer.

28. The method of any one of clauses 26 and 27, wherein the first and second landing energy beams have different energy levels.

29. The method of any one of clauses 26-28, wherein the first landing energy beam is provided as an on-axis beam and the second landing energy beam is provided as an off-axis beam.

30. A method for determining an overlay measurement or a critical dimension or detecting a defect with a scanning electron microscope based on images obtained with beams of different landing energies, the method comprising:
scanning a sample with electrons having a first energy level, from a first electron source, to obtain a first image while a first blanker blanks electrons from a second electron source;
scanning the sample with electrons having a second energy level, from a second electron source, to obtain a second image while a second blanker blanks electrons from the first electron source; and
determining an overlay measurement or a critical dimension or detecting a defect based on the first image and the second image.

A non-transitory computer readable medium may be provided that stores instructions for a processor of a controller (e.g., controller 40 of FIG. 1) to carry out image inspection, image acquisition, stage positioning, beam focusing, electric field adjustment, beam bending, condenser lens adjusting, activating charged-particle source, beam deflecting, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which comprises one or more executable instructions for implementing the specified logical functions. It is to be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A system, comprising:
a first energy source configured to provide a first landing energy beam;
a second energy source configured to provide a second landing energy beam; and
a beam controller configured to:
selectively deliver one of the first and second landing energy beams towards a field of view by selecting a mode of operation from among modes of operation of the system, wherein the modes of operation comprise:
an interlaced scan mode that interlaces, in the field of view, scan lines based on the first landing energy beam and scan lines based on the second landing energy beam; and
an other scan mode that first scans the field of view using the first landing energy beam and then scans the field of view using the second landing energy beam; and
switch between delivery of the first and second landing energy beams according to the interlaced scan mode or the other scan mode.

2. The system of claim 1, wherein the system is a scanning electron microscope (SEM) and the first and second landing energy beams configured to produce an image of a wafer.

3. The system of claim 1, wherein the first and second landing energy beams have different energy levels.

4. The system of claim 1, wherein the first landing energy beam is an on-axis beam and the second landing energy beam is an off-axis beam.

5. The system of claim 1, wherein the beam controller comprises:
a beam selector positioned to receive both the first and second landing energy beams, the beam selector being configured to allow delivery of only a selected one of the first and second landing energy beams towards the field of view at a time.

6. The system of claim 5, wherein the beam selector is configured to direct an unselected one of the first and second landing energy beams away from the field of view.

7. The system of claim 5, wherein the beam selector is configured to operate in one of:
a disengaged state, wherein the beam selector allows delivery of the first landing energy beam towards the field of view and disallows delivery of the second landing energy beam towards the field of view; or
an engaged state, wherein the beam selector deflects the first landing energy beam away from the field of view and deflects the second landing energy beam towards the field of view.

8. The system of claim 5, wherein the beam selector comprises at least one of: an electrostatic deflector or a magnetic deflector or a Wien filter.

9. The system of claim 5, wherein the beam controller further comprises:
a first beam blanker configured to deflect the first landing energy beam when the first beam blanker is engaged to prevent delivery of the first landing energy beam towards the beam selector; and
a second beam blanker configured to deflect the second landing energy beam when the second beam blanker is engaged to prevent delivery of the second landing energy beam towards the beam selector.

10. The system of claim 9, wherein the beam controller is configured to selectively engage one of the first and second beam blankers so that only one of the first and second landing energy beams is delivered to the beam selector at a time.

11. The system of claim 5, wherein the beam controller further comprises:
a beam-limiting aperture positioned on beam paths of both the first and second landing energy beams.

12. The system of claim 11, wherein when the beam selector operates to allow delivery of the first landing energy beam towards the field of view, the beam-limiting aperture blocks the second landing energy beam.

13. The system of claim 11, wherein when the beam selector operates to deflect the first landing energy beam away from the field of view, the beam-limiting aperture allows delivery of the second landing energy beam towards the field of view.

14. The system of claim 1, further comprising:
at least one scanning deflector configured to direct one of the first and second landing energy beams selectively delivered towards the field of view to facilitate scanning of a wafer within the field of view.

15. A method for determining an overlay measurement or a critical dimension or detecting a defect with a scanning electron microscope based on images obtained with beams of different landing energies, the method comprising:
selectively delivering electrons from one of a first electron source at a first energy level and a second electron source at a second energy level towards a sample by selecting a mode of operation from among modes of operation of the scanning electron microscope, wherein the modes of operation comprise:

an interlaced scan mode that interlaces scan lines of electrons from the first electron source and scan lines of electrons from the second electron source; and an other scan mode that first scans the sample using the first electron source and then scans the sample using the second electron source;

switching between delivery of electrons from one of the first and second electron sources according to the interlaced scan mode or the other scan mode; and scanning the sample using electrons from a first electron source to obtain a first image while a first beam blanker blanks electrons from the second electron source;

scanning the sample using electrons from the second electron source to obtain a second image while a second beam blanker blanks electrons from the first electron source; and determining an overlay measurement or a critical dimension or detecting a defect based on analysis of a structure of the sample captured in the first image and the second image.

16. A non-transitory computer-readable medium that stores a set of instructions that is executable by at least one processor of a charged-particle-based inspection system to cause the charged-particle-based inspection system to perform operations, the charged-particle-based inspection system comprising first and second energy sources for providing first and second landing energy beams, and the operations comprising:

selectively delivering one of the first and second landing energy beams towards a field of view by selecting a mode of operation from among modes of operation of the inspection system, wherein the modes of operation comprise:

an interlaced scan mode that interlaces, in the field of view, scan lines based on the first landing energy beam and scan lines based on the second landing energy beam; and an other scan mode that first scans a field of view using the first landing energy beam and then scans the field of view using the second landing energy beam; and switching between delivery of the first and second landing energy beam according to the interlaced scan mode or the other scan mode.

17. The non-transitory computer-readable medium of claim 16, wherein the first and second landing energy beams have different energy levels.

18. The non-transitory computer-readable medium of claim 16, wherein the first landing energy beam is an on-axis beam and the second landing energy beam is an off-axis beam.

19. The non-transitory computer-readable medium of claim 16, wherein selectively delivering comprises delivering only a selected one of the first and second landing energy beams towards the field of view at a time using a beam selector positioned to receive both the first and second landing energy beams.

20. The non-transitory computer-readable medium of claim 16, wherein selectively delivering comprises:

deflecting the first landing energy beam when a first beam blanker of the charged-particle-based inspection system is engaged to prevent delivery of the first landing energy beam towards a beam selector; and deflecting the second landing energy beam when a second beam blanker of the charged-particle-based inspection system is engaged to prevent delivery of the second landing energy beam towards the beam selector.

* * * * *